United States Patent [19]

Blaser et al.

[11] 4,110,633

[45] Aug. 29, 1978

[54] DEPLETION/ENHANCEMENT MODE FET LOGIC CIRCUIT

[75] Inventors: Eugene Martin Blaser, Hopewell Junction; Donald Adelbert Conrad, Fishkill, both of N.Y.

[73] Assignee: International Business Machines Corporation, Armonk, N.Y.

[21] Appl. No.: 811,737

[22] Filed: Jun. 30, 1977

[51] Int. Cl.² .................. H03K 19/08; H03K 19/34; H03K 19/32; H03K 17/60
[52] U.S. Cl. ................................. 307/205; 307/214; 307/215; 307/218; 307/270; 307/DIG. 1
[58] Field of Search ............... 307/205, 214, 215, 218, 307/264, 270, DIG. 1, DIG. 5

[56] References Cited

U.S. PATENT DOCUMENTS

| | | | |
|---|---|---|---|
| 3,623,132 | 11/1971 | Green | 307/205 |
| 3,832,574 | 8/1974 | Leehan | 307/215 X |
| 3,943,377 | 3/1976 | Suzuki | 307/215 X |
| 3,991,326 | 11/1976 | Kawagde et al. | 307/270 |

OTHER PUBLICATIONS

Freeman et al., "Level Shifting Circuit", *IBM Tech. Discl. Bull.,* vol. 18, No. 5, p. 1450, 10/1975.
Lohman, "Applications of MOSFETs in Electronics", *SCP and Solid-State Technology,* (pub.), pp. 23-29, 3/1966.
Askin et al., "Level Converting Circuit", *IBM Tech. Discl. Bull.,* vol. 18, No. 11, p. 3723, 4/1976.
Elliott et al., "Regenerative TTL Receiver Using Enhancement and Depletion FET Devices", *IBM Tech. Discl. Bull.,* vol. 18, No. 10, pp. 3259-3260, 3/1976.

*Primary Examiner*—Larry N. Anagnos
*Attorney, Agent, or Firm*—Theodore E. Galanthay

[57] ABSTRACT

Disclosed is a field effect transistor (FET) logic circuit which advantageously combines enhancement and depletion mode field effect transistors. A depletion mode input transistor is connected between an input node and an intermediate node and has its gating electrode connected to a fixed potential such as ground. A self-biased depletion mode field effect load transistor is connected between a positive potential and the same intermediate node to which the gating electrode of one or more enhancement mode field effect transistors are also connected. The source electrodes of the enhancement mode field effect transistors are connected to a fixed source of potential such as ground while the drain electrodes of the enhancement mode field effect transistors provide open drain outputs to similarly constructed subsequent logic stages. A number of these open drain logic outputs may be connected together to form DOT logic configurations and the potential swing at these open drain outputs, being a function of the threshold voltage of the subsequent stage input device, is substantially less than the potential difference between the fixed positive and ground supply potentials.

11 Claims, 6 Drawing Figures

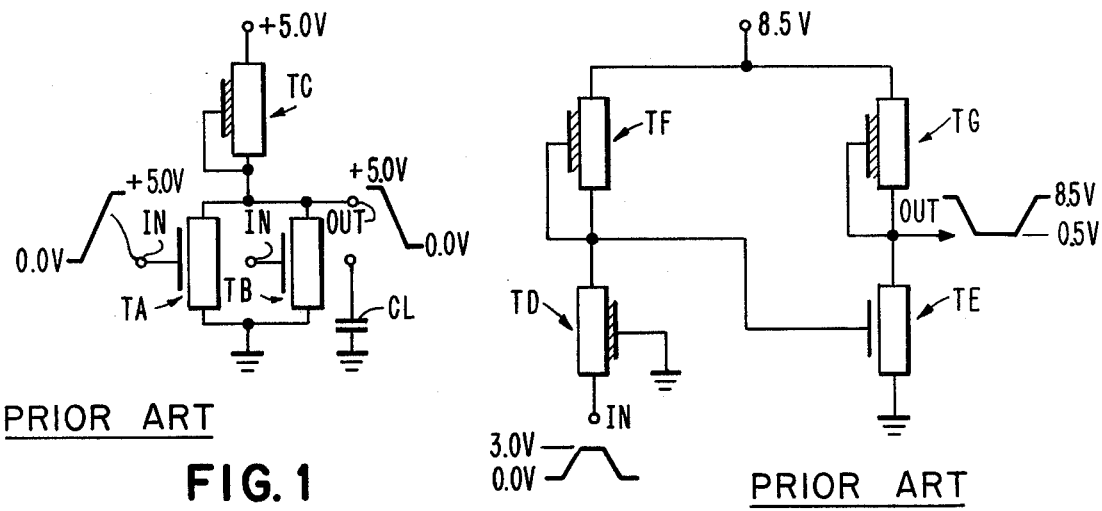
PRIOR ART
FIG. 1
PRIOR ART
FIG. 2
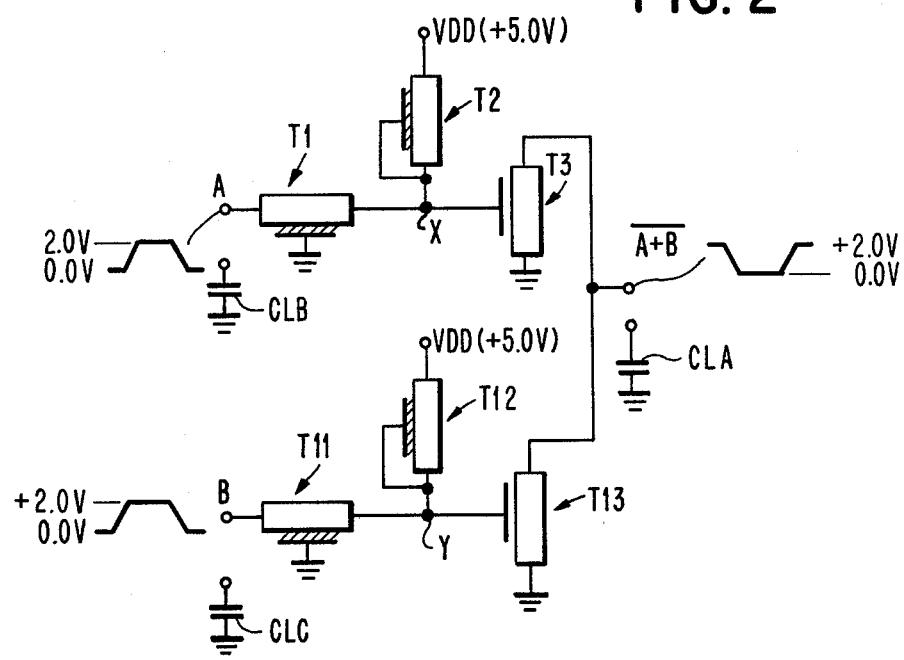
FIG. 3

DEPLETION/ENHANCEMENT MODE FET LOGIC CIRCUIT

CROSS REFERENCE TO RELATED PATENT APPLICATIONS/PATENTS AND PUBLICATIONS

1. IBM Technical Disclosure Bulletin (TDB) Volume 18, No. 5, October 1975, page 1450, Freeman et al.
2. IBM Technical Disclosure Bulletin (TDB) Volume 18, No. 11, April 1976, page 3723, Askin et al.

BACKGROUND OF THE INVENTION

1. Field of the Invention

This invention relates to field effect transistor logic circuits and more particularly to a high speed and low power enhancement/depletion mode FET logic circuit.

2. Description of the Prior Art

FET logic circuits employing both depletion mode and enhancement mode field effect transistors are well known in the art. For example, the NOR circuit illustrated in FIG. 1 includes a plurality of parallel connected enhancement mode devices such as TA and TB and a depletion mode load FET TC. An up level input signal on any of the input nodes will produce a down level output signal. When all the input nodes are maintained at a down level, the output node will charge to an up level. A known advantage of the self-biased depletion mode FET load device TC is that the output node is permitted to charge to a full up level provided by the positive supply potential. A more detailed description of this prior art circuit is found, for example, in Proebsting U.S. Pat. No. 3,775,693.

A problem with the above described logic circuit is that the internal logic nodes must switch from 0 volts to +5 volts and vice versa (a 5 volt logic swing) in order to propagate binary logic information. Typically, hundreds of such logic circuits may be placed on a single semiconductor chip. Such FET circuits are known to have relatively high load capacitances as illustrated by capacitance CL in FIG. 1 which must be charged and discharged during each switching transition. Each of the field effect transistors within the circuit has a finite transconductance in its on state which, together with the load capacitance, forms an RC circuit. It is known to increase the transconductance of field effect transistors for the purpose of reducing the RC time constant and thereby to increase the switching speed of the circuit. Unfortunately, field effect transistors with a higher transconductance also consume larger amounts of power and usually occupy more space on the semiconductor surface, both the aforementioned characteristics being highly undesirable.

Also known in the prior art are other applications for depletion/enhancement mode field effect transistors as illustrated in the above named IBM TDB to Freeman et al. Such circuits are required for converting potential levels compatible with bipolar logic levels to field effect transistor logic levels. The circuit from the Freeman et al TDB is reproduced as prior art FIG. 2. As illustrated, the circuit accepts an input logic swing of from 0 to +3 volts and provides an output logic swing of from 0.5 to +8.5 volts. The circuit includes enhancement mode device TE and depletion mode devices TD, TF, and TG. The input is received at the source of grounded gate device TD and is provided to the gate electrode of enhancement mode device TE which acts as an inverter with self-biased depletion mode load device TG.

A circuit quite similar to that described in the aforementioned Freeman et al. TDB is also illustrated in the above named Askin et al. TDB. The IBM TDB to Askin et al describes a level converting circuit including two depletion mode field effect transistors corresponding to devices TD and TF in the Freeman et al. TDB. In the Askin et al. circuit, specific width to length ratios and threshold voltage levels are disclosed and the supply and input potential levels are different. Otherwise, the circuits in the two TDB's perform the same function and both provide output logic swings substantially equal to the difference of the applied supply potentials. Since the output logic voltage swings described in all of the aforementioned prior art (both FIG. 1 and FIG. 2) are substantially equal to the full supply potential, power dissipation and logic switching times are presumed to be comparable.

SUMMARY OF THE INVENTION

It is an object of this invention to provide an enhancement/depletion mode FET circuit with improved power/performance characteristics.

It is a further object of this invention to reduce logic voltage swings without decreasing the transconductance of the output device.

It is another object of this invention to provide DOT logic capability to an FET circuit.

Lastly, it is an object of this invention to provide FET logic circuits having binary logic voltage swings substantially less than the potential difference of the applied supply potential.

In accordance with the present invention, an enhancement/depletion mode FET logic circuit is provided. The basic building block includes two depletion mode field effect transistors and one or more enhancement mode field effect transistors. A first depletion mode device has its drain to source path connected between an input node and an intermediate node while its gate electrode is connected to a first fixed potential such as ground. A self-biased depletion mode field effect transistor is connected between the positive potential VDD and the same intermediate node. The one or more enhancement mode output field effect transistors have their gate electrodes connected in common to the same intermediate node, while their source electrodes are connected to a more negative source of fixed potential, such as ground. The drain electrodes of the one or more enhancement mode output field effect transistors provide open drain outputs to subsequent stages. A plurality of such building block circuits are connected both in parallel and in series to perform logic functions on a semiconductor chip. The output logic swings at the open drain outputs of the enhancement mode field effect transistors are dependent on the threshold voltage of the subsequent stage input depletion mode field effect transistor.

Accordingly, assuming a positive potential of +5 volts and a negative potential of 0 volts applied as supply potentials to the logic circuits and a threshold voltage of the depletion mode input device of −2 volts; then the potential at the open drain output electrodes will vary from approximately 0 volts to approximately +2 volts. This is different from prior art FET logic circuits in which the logic voltage swing at the output of each building block logic circuit was approximately equal to the supply potential. Such a reduced logic voltage swing reduces the power consumption/heat dissipation requirements and improves the performance of the circuit.

The enhancement mode transistor (output device) receives a full logic swing at its gate electrode, thereby maintaining its transconductance. If the gate electrode of the enhancement mode transistor were to receive a reduced logic up level, then its size (W/L ratio) would have to be increased to maintain its transconductance. A larger device would have a larger input capacitance, slowing down the circuit operation. Thus, the present circuit provides at least a 5 to 1 power/performance improvement over the FIG. 1 prior art circuit when laid out in a comparable or even lesser semiconductor chip area.

The foregoing and other objects, features and advantages of the invention will be apparent from the following and more particular description of a preferred embodiment of the invention, as illustrated in the accompanying drawings.

IN THE DRAWINGS

FIGS. 1 and 2 illustrate prior art depletion/enhancement mode field effect transistor circuits.

FIG. 3 is a circuit diagram illustrating one form of a logic circuit constructed in accordance with the present invention.

DETAILED DESCRIPTION

Refer now to FIG. 3 for a description of the preferred embodiment. FIG. 3 illustrates a NOR logic circuit capable of performing the identical logic function performed by the prior art circuit of FIG. 1. A first input provided to the circuit at terminal A is connected to one of the controlled electrodes of depletion mode field effect transistor T1. The other controlled electrode of depletion mode FET T1 is connected to intermediate node X. The controlling electrode (gate electrode) of T1 is connected to ground potential. The threshold voltage of T1 is typically designed to be approximately $-2$ volts although different threshold voltages can be designed into transistor T1 by techniques notoriously well known in the device fabrication art. Depletion mode device T2 has one of its controlled electrodes also connected to the intermediate node X while the other controlled electrode is connected to a potential supply VDD. Depletion mode device T2 is a self-biased load device having its gating electrode connected to the controlled electrode which is also connected to intermediate node X. Enhancement mode field effect transistor T3 has one of its controlled electrodes (i.e. the source electrode) connected to ground potential while the other controlled electrode (i.e. the drain electrode) is connected to the output node. The gate electrode of T3 is connected to intermediate node X.

With continuing reference to FIG. 3, note that the connection and mode of transistors T11, T12, and T13 is identical to that of T1, T2 and T3, respectively. The input to one of the controlled electrodes of T11 is received at input terminal B, transmitted to the intermediate node Y, and the gating electrode of T13. The open drain output electrode of T13 is also connected to the output node so that the outputs of T3 and T13 form a DOT logic configuration.

Figure 4:
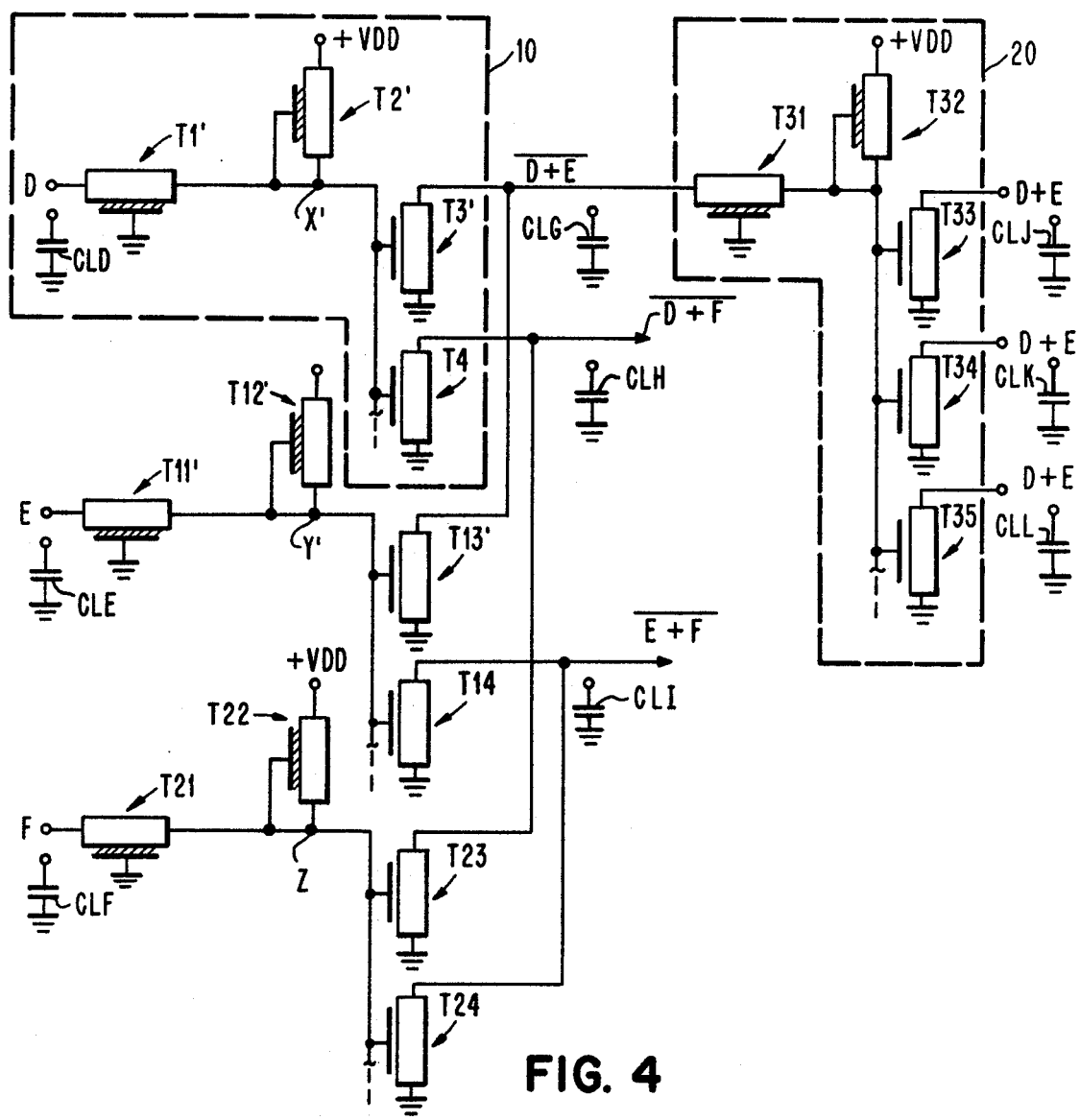
FIG. 4 is another form of a logic circuit constructed in accordance with the present invention.

With continued reference to FIG. 3, also refer to FIG. 4 which illustrates a more extensive logic circuit, in accordance with the present invention. The circuit of FIG. 3 can be found within the circuit of FIG. 4 and corresponding circuit elements have been designated with prime notation insofar as practical. Thus, transistors T1', T2', and T3' as well as node X' correspond directly to their "unprimed" reference numeral counterparts in FIG. 3. Logic block 10 includes the aforementioned three transistors as well as a fourth enhancement mode device T4. Transistor T4 has its gate electrode connected to the intermediate node X', its source electrode connected to ground, and its drain connected to the open drain output. This illustrates a fan out capability of 2 for logic block 10. Additional fan out capability is possible and illustrated in the form of dotted lines from the gate electrode of T4.

Transistors T11', T12', and T13' correspond identically to their counterpart "unprimed" devices in FIG. 3. Device T14 having its gate connected to intermediate node Y', its source electrode connected to ground and its drain electrode connected to the output illustrates the fan out capability of this second leg of the overall logic circuit. Transistors T21, T22, T23, and T24 are identical in construction and interconnection to transistors T11', T12', T13', and T14, respectively. The open drain outputs of T3' and T13' are connected in common while the open drain outputs of T4 and T23 are also connected in common. Similarly, the open drain outputs of T14 and T24 are connected in common. These interconnections provide particular desired DOT logic functions. Accordingly, the particular selected interconnections depend on the logic function desired to be performed.

With continued reference to FIG. 4, basic logic building block 20 will now be described. It is noted that the only distinction between logic block 20 and logic block 10 is that 3 enhancement mode field effect transistors have been illustrated to particularly point out a fan out capability of 3. Otherwise, the structure and interconnection of transistors T31, T32, T33, and T34, is identical to that of T1', T2', T3', and T4, respectively. Additionally note the third enhancement mode transistor T35 having its gating electrode connected to the intermediate node, its source connected to ground potential and its open drain output going to an output node. The input to T31 is provided by the open drain outputs of T3' and T13'.

What has been described to this point is examples of internal logic circuits and logic terminals and nodes within a semiconductor chip that are normally inaccessible. When the final logic signal is desired external to the semiconductor logic chip, a circuit of the type illustrated in FIG. 5 can be utilized. The circuit consists of depletion mode devices T41 and T42 and enhancement mode device T43. The input node to this circuit is typically connected to one of the outputs of a circuit such as logic circuit 20 (FIG. 4). Transistors T41, T42, and T43 have structures and connections similar to those of T1, T2, and T3, respectively, as previously described for FIG. 3. However, in order to provide a larger logic swing, particularly a higher up level output, a load resistor R is connected between a positive source of potential $+V2$ and the drain of T43. Thus, T43 no longer provides an open drain output. Resistor R is preferably supplied off-chip so that its power consumption and heat dissipation need not be taken into consideration in the chip and chip packaging design. It is also noted that transistor T43 may be designed much larger than its counterpart in the internal logic circuits. Since a given semiconductor chip has a limited number of off chip drivers, making T43 and its counterpart off chip driver transistors larger does not occupy a significantly increased amount of semiconductor space in the overall logic configuration. It is further noted with respect to the circuit of FIG. 5 that one terminal of R has been connected to +V2 which may be higher than +VDD for an even greater logic voltage output swing. Of course, it may be equally desirable to let +V2 be equal to or less than +VDD. In lieu of the output driver circuit illustrated in FIG. 5, other circuits could also be used. For example, the level shifting circuit of Freeman et al described hereinabove and shown in FIG. 2, could be modified to receive the internal logic swing of 0 to +2.0 volts and provide an output of 0.5 to +8.5 volts as shown therein.

Figure 6:
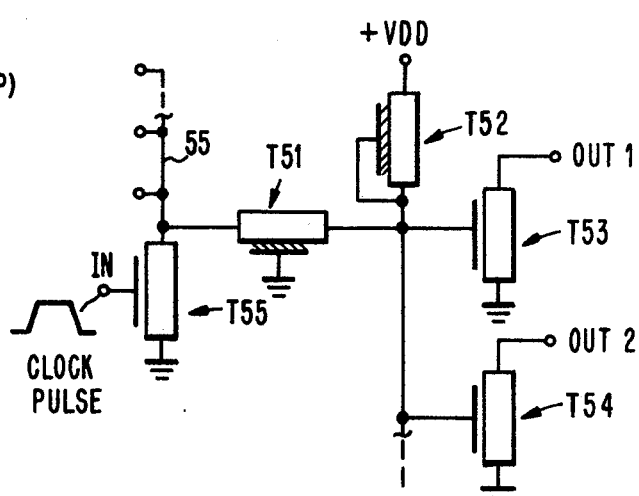
FIG. 6 is a circuit diagram illustrating an input circuit that can be used with the present invention.

In the same way that a particular output circuit provides the necessary off chip drive capability to the herein circuit, an example of a particular input or "receiver" circuit is illustrated in FIG. 6. The off-chip (or other source of input) signal is provided to the gating electrode of enhancement mode device T55 which has its drain to source path connected between one of the controlled electrodes of T51 and ground. The other controlled electrode of depletion mode device T51 is connected to an intermediate node while its gating electrode is connected to ground. Self-biased depletion mode load FET T52 has its drain to source path connected between +VDD and the intermediate node while its gating electrode is also connected to the intermediate node. A number of enhancement mode devices e.g. T53 and T54 (depending on the desired fan out) have their gates connected to the intermediate node while their source electrodes are connected to ground potential. The drain of T53 is connected to output 1 while the drain of T54 is connected to output 2 and these outputs would typically be inputs to internal logic terminals such as either input terminal A or B shown in FIG. 3, for example.

The circuit of FIG. 6 can also be used with a large fan in, as illustrated by line 55 connected to the additional input terminals. These input terminals would typically be connected to the output DOT connections from the drain electrodes of the enhancement mode output FET's. This provides additional logic flexibility, particularly by reducing signal distribution constraints and wiring requirements. Transistor T55 performs the function of an inhibit device permitting a large number of logic functions to be simultaneously clocked to a succeeding stage.

OPERATION

Refer now again to the circuit of FIG. 3 for a description of its operation. A first input signal is received at terminal A. Assuming the indicated supply potential levels and further assuming that the threshold of depletion mode device T1 is −2 volts, the input signal would be in the range of 0 volts to −2 volts. Assume first that terminal A is at 0 volts. This provides a DC path from the +5 volts supply to 0 volts through devices T2 and T1. The width to length ratios of T2 and T1 are selected so that the transconductance of T1 is much higher than that of T2. Conversely, T2 has a higher internal impedance in the on state than T1. The resultant voltage divider effect brings node X to near 0 volts. Since the source of T3 is connected to ground, the gate to source bias on T3 keeps it off.

At this point assume that the previous device (not shown in FIG. 3) holding terminal A at 0 volts is turned off so that terminal A is effectively open circuited. Intermediate node X will immediately begin to charge to an up level by means of current from the VDD supply through T2. As node X rises, node A also begins to rise. It is here noted that input node A is still connected to the output node of the previous stage and must, therefore, charge load capacitor CLB. However, as soon as node A has been charged to +2 volts, depletion mode device T1 (which for purposes of the present example has been designated as having a threshold voltage of −2 volts) cuts off, thereby isolating node A from node X. This substantially reduces the capacitance remaining to be charged through device T2 so that node X effectively snaps to +5 volts turning T3 fully on, thereby discharging load capacitance CLA. This brings the output potential from +2 volts to 0 volts as the input to the next stage. A subsequent down going transition at input terminal A discharge capacitors CLB, and brings node X back to a down level.

The operation of up and down level logic signals on input terminal B and their effect on the operation of transistors T11, T12, and T13 is identical to that just described for an input at terminal A and the operation of T1, T2, and T3, respectively. The drain electrodes of T3 and T13 are connected together in a DOT logic configuration. Thus, an up level input at either terminal A or terminal B will discharge load capacitance CLA and result in a down level output at the output terminal. This has been designated as inverted (A + B). Those skilled in the art will recognize this as a DOT NOR logic function. The power/performance advantages of this logic circuit are achieved by the ability to charge and discharge the large load capacitances such as CLA, CLB, and CLC with only a 2 volt swing while the enhancement mode output transistors such as T3 and T13 receive at their gating electrodes a full 5 volt logic swing is an input.

The aforementioned advantages are even better seen by reference to the more extensive logic circuit illustrated in FIG. 4. Since the circuit of FIG. 4 is merely an expansion of the circuit of FIG. 3, comparable supply voltages are assumed and will apply. Thus, a 0 level input at node D will provide a near 0 volt level at node X'. However, if node X' is permitted to charge to +VDD, then node D will charge to the voltage limited by the threshold voltage of depletion mode device T1' (e.g. 2 volts). A down level input at node D will turn T3' off while an up level input at node D will turn T3' on. Similarly, the conductive state of T4 will always be the same as that of T3'. Again note the large node capacitances such as CLD through CLL which result from the conductive metallurgy on the semiconductor chip and are the largest capacitances present in the circuit.

For a further description of the operation, consider the case where both input terminals D and E are held at ground potential. In this case, nodes X' and Y' are also at a down potential and enhancement mode output devices T3', T4, T13' and T14 are all off. This causes the common connection of the drain electrodes of T3' and T13' to charge to +2 volts through T32 and T31. This fulfills the logical requirement that when both D and E are at a down level then the common drain connection (DOT) of T3' and T13' will be at an up level and is designated as NOT (D + E). It is recognized that this is the same logic function as NOT D AND NOT E. With the input to T31 charged to an up level, the gate electrodes of T33, T34, and T35 are all at an up level (+VDD) so that these latter three transistors are on. Thus, all three outputs are off. This is illustrated by the output designation that either D or E must be up in order for the output to be at a logical up level.

Assume that at the same point in time that nodes D and E are at down levels, node F is permitted to charge to +2 volts through T22 and T21. After capacitance CLF has been charged to +2 volts, T21 turns off permitting node Z to be quickly charged to +VDD causing T23 and T24 to snap on thereby discharging node capacitances CLH and CLI. This fulfills the logical requirement that both these nodes must be at a down level so long as node F is at an up level. A further detailed explanation of the possible logical function appears not necessary as those skilled in the art of logic design will readily expand on the aforementioned examples.

Figure 5:
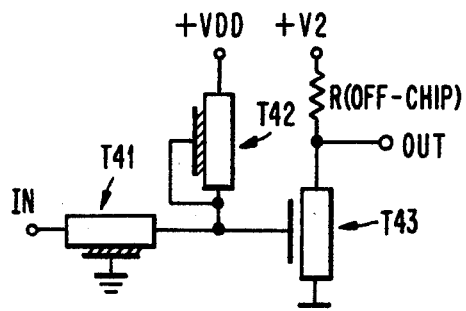
FIG. 5 is an illustration of an "off chip" driver that can be utilized with the present invention.

Refer now to FIG. 5 which receives at its input terminal either a grounding input or an open circuit permitting its input terminal to charge to +2 volts based on the threshold voltage of T41. This permits T42 to charge the gate of T43 to +5 volts turning it on and bringing the output node to near 0 volts. The down level is improved by increasing the size of T43 or, in the alternative, increasing the impedance of R. When the output to the FIG. 5 circuit is grounded, the gate of T43 is brought to a down level, turning T43 off. This causes the output node to charge to an up level through resistance R. The up going transition of the output node is improved by reducing the impedance of R and the ultimate up level is increased by increasing the potential supply +V2. Resistor R being usually an off-chip resistor can be designed as a relatively large power resistor. The aforementioned tradeoffs in terms of speed and power consumption in the design of resistor R and transistor T43 are well known to those skilled in the art.

Refer now to FIG. 6 which illustrates an input (or "receiver") circuit to a logic circuit of the present invention. The input of the gate of T55 will typically vary from ground potential to +VDD (e.g. 5 volts or more). When T55 is off, its drain will charge to +2 volts by means of current flow through T52 and T51. The intermediate node and the gates of T53 and T54 will be charged to +VDD (e.g. +5 volts) turning T53 and T54 on thereby providing a ground potential to the input nodes of subsequent logic stages. In the alternate case when T55 is on, the intermediate node and the gates of T53 and T54 will discharge through T51 and T55. This will cause T53 and T54 to be off permitting their output nodes (OUT 1 and OUT 2) to be charged to +2 volts by the subsequent logic stage as has been described in great detail herein.

What has then been described is a completely new logic configuration for enhancement/depletion mode field effect transistors with substantially improved power/performance characteristics. While the invention has been particularly shown and described with reference to preferred embodiments, it will be understood by those skilled in the art that various changes in form and detail may be made therein without departing from the spirit and scope of the invention. For example, the input transistors such as T1 could be positively biased N-channel enhancement mode FET's. Also, load devices such as T2 could be any known FET load device either self-biased or gate biased such as a linear load enhancement mode FET illustrated in U.S. Pat. No. 3,406,298. Also, the entire circuit could be implemented in P-channel or CMOS technology.

What is claimed is:

1. An improved field effect transistor logic circuit comprising:
    a first depletion mode input field effect transistor having its drain to source path connected between an input node and a first intermediate node and its gate electrode connected to a first fixed potential;
    a self biased second depletion mode field effect transistor connected as a load between a second fixed potential and said first intermediate node;
    at least one enhancement mode output field effect transistor having its gate electrode connected to said first intermediate node, its source electrode connected to said first fixed potential and its drain electrode connected to an output node having a substantial load capacitance associated therewith; and
    a third depletion mode field effect transistor having its drain to source path connected between a second intermediate node and the drain of said at least one enhancement mode output field effect transistor and its gate electrode connected to said first fixed potential; and
    a fourth depletion mode field effect transistor connected between said second fixed potential and said second intermediate node;
    whereby said output node connected to the drain electrode of said at least one enhancement mode output field effect transistor has a potential variable between said first fixed potential and another potential which is a function of the threshold voltage of said third depletion mode field effect transistor.

2. An improved field effect transistor logic circuit as in claim 1 wherein said second potential is higher than said first potential.

3. An improved field effect transistor logic circuit as in claim 2 further comprising:
    a fifth depletion mode field effect transistor having its drain to source path connected between another input node and a third intermediate node and its gate electrode connected to said first fixed potential;
    a self biased sixth depletion mode field effect transistor connected as a load between said second fixed potential and said third intermediate node; and
    another at least one enhancement mode output field effect transistor having its gate electrode connected to said third intermediate node, its source electrode connected to said first fixed potential and its drain electrode connected to said same output node having a substantial load capacitance associated therewith.

4. An improved field effect transistor logic circuit as in claim 3 comprising:
    an additional at least one enhancement mode output field effect transistor having its gate electrode connected to said second intermediate node, its source electrode connected to said first fixed potential and its drain electrode connected to another output node having a substantial load capacitance associated therewith.

5. An improved field effect transistor logic circuit comprising:

a first input field effect transistor having its drain to source path connected between an input node and a first intermediate node and its gate electrode connected to a first fixed potential;

a load field effect transistor having its drain to source path connected between a second fixed potential and said first intermediate node;

a plurality of enhancement mode output field effect transistors having gate, source, and drain electrodes, their gate electrodes connected in common to said first intermediate node, their source electrodes connected to said first fixed potential; and a second input field effect transistor providing an input to a subsequent stage having its gate electrode connected to said first fixed potential and its drain to source path connected in an electrical path, including a load, between an output node formed by the drain electrode of at least one of said plurality of enhancement mode output field effect transistors and said second fixed potential.

6. An improved field effect transistor logic circuit as in claim 5 wherein said first, second, and load field effect transistors are of the depletion mode.

7. An improved field effect transistor logic circuit as in claim 6 wherein said load field effect transistor is self biased.

8. An improved field effect transistor logic circuit as in claim 5 wherein said second potential has a potential level higher than the potential level of said first potential.

9. An improved field effect transistor logic circuit as in claim 5 wherein said load comprises:

another load field effect transistor connected between said second fixed potential and said second input field effect transistor and forming another intermediate node therewith.

10. An improved field effect transistor logic circuit as in claim 9 comprising:

an additional at least one enhancement mode output field effect transistor having its gate electrode connected to said another intermediate node, its source electrode connected to said first fixed potential and its drain electrode connected to another output node having a substantial load capacitance associated therewith.

11. An improved field effect transistor logic circuit as in claim 5 further comprising:

a third input field effect transistor having its drain to source path connected between another input node and a second intermediate node and its gate electrode connected to said first fixed potential;

a second load field effect transistor connected between said second fixed potential and said second intermediate node; and another at least one enhancement mode output field effect transistor having its gate electrode connected to said second intermediate node, its source electrode connected to said first fixed potential and its drain electrode connected to said same output node.

* * * * *